(12) United States Patent
Yoshida et al.

(10) Patent No.: US 12,557,657 B2
(45) Date of Patent: Feb. 17, 2026

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Akito Yoshida, Singapore (SG); Glen Siew, Singapore (SG); Dong Su Ryu, Incheon (KR); Min Jae Kong, Seoul (KR); Jo Hyun Bae, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 813 days.

(21) Appl. No.: 17/853,581

(22) Filed: Jun. 29, 2022

(65) Prior Publication Data

US 2024/0006337 A1 Jan. 4, 2024

(51) Int. Cl.
*H01L 23/552* (2006.01)
*H01L 21/48* (2006.01)
*H01L 21/56* (2006.01)
*H01L 23/498* (2006.01)
*H01L 25/00* (2006.01)
(Continued)

(52) U.S. Cl.
CPC ........ *H01L 23/552* (2013.01); *H01L 21/4853* (2013.01); *H01L 21/56* (2013.01); *H01L 23/49816* (2013.01); *H01L 25/0655* (2013.01); *H01L 25/50* (2013.01); *H01L 24/16* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/16227* (2013.01); *H01L 2924/0132* (2013.01); *H01L 2924/0133* (2013.01)

(58) Field of Classification Search
None
See application file for complete search history.

(56) References Cited

U.S. PATENT DOCUMENTS

| 7,451,539 | B2 | 11/2008 | Morris et al. |
| 9,484,313 | B2 * | 11/2016 | Chung ............... H01L 21/565 |
| 10,424,556 | B2 | 9/2019 | Chun et al. |

(Continued)

*Primary Examiner* — Long Pham
(74) *Attorney, Agent, or Firm* — Kevin B. Jackson

(57) ABSTRACT

In one example, an electronic device includes a substrate having an upper side, a lower side opposite to the upper side, a lateral side connecting the upper side to the lower side, and a conductive structure. An electronic component is coupled to the conductive structure at the upper side of the substrate. An encapsulant covers a lateral side of the electronic component and the upper side of the substrate and having an encapsulant top side and an encapsulant lateral side. The electronic device includes first metallic coating having a first metallic coating top side, a first metallic coating sidewall; and a first metallic coating thickness. The electronic device includes a second metallic coating having a second metallic coating thickness that is greater than the first metallic coating thickness. In the present example, the first metallic coating top side is over the encapsulant top side, the first metallic coating sidewall is over the encapsulant lateral side, and the second metallic coating is over the encapsulant top side. Other examples and related methods are also disclosed herein.

23 Claims, 17 Drawing Sheets

(51) Int. Cl.
*H01L 25/065* (2023.01)
*H01L 23/00* (2006.01)

(56) References Cited

U.S. PATENT DOCUMENTS

| | | |
|---|---|---|
| 10,636,765 B2 * | 4/2020 | Yang .................... H01L 23/552 |
| 2005/0008316 A1 | 1/2005 | Yeniay |
| 2014/0016293 A1 * | 1/2014 | Song .................... H05K 1/0218 |
| | | 29/829 |
| 2017/0365534 A1 | 12/2017 | Machida et al. |
| 2021/0066206 A1 * | 3/2021 | Oh ........................ H01L 25/105 |

* cited by examiner

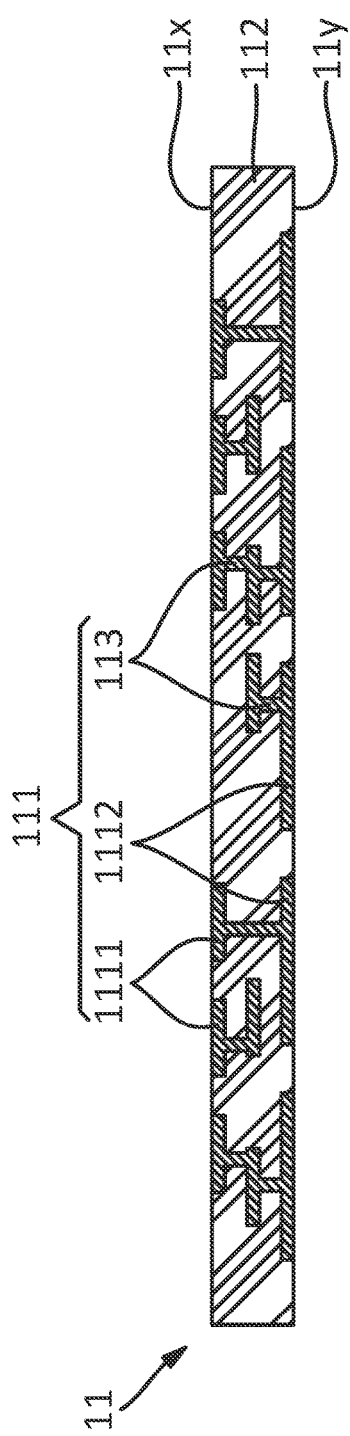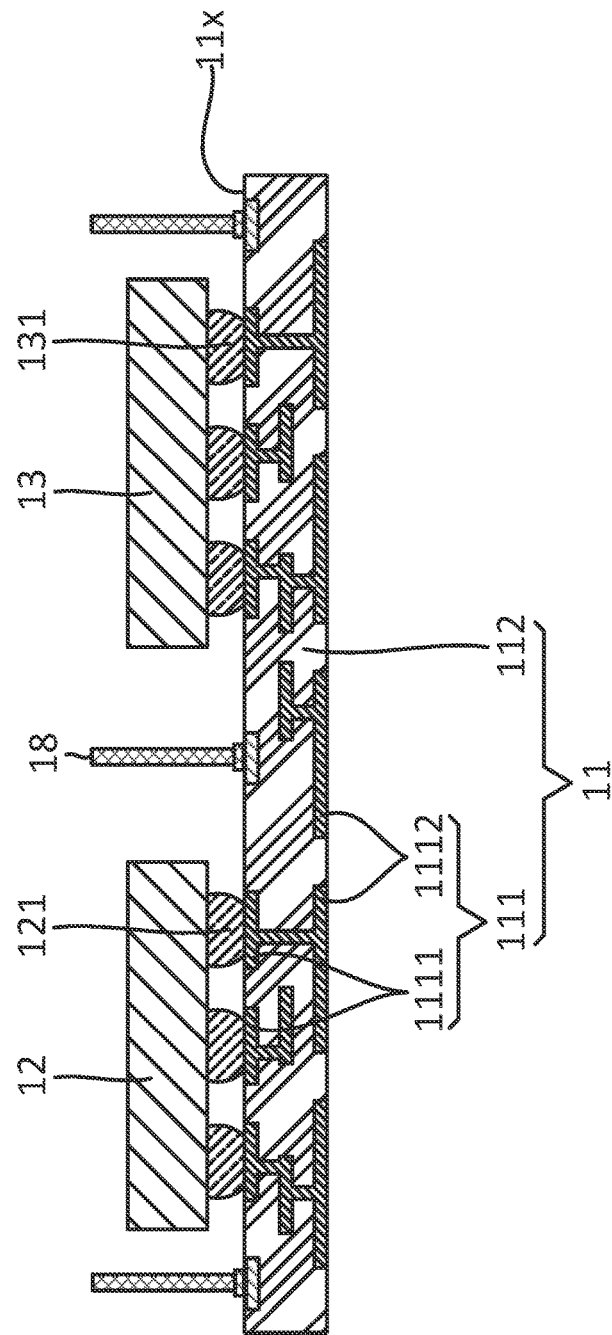
FIG.2A
FIG.2B

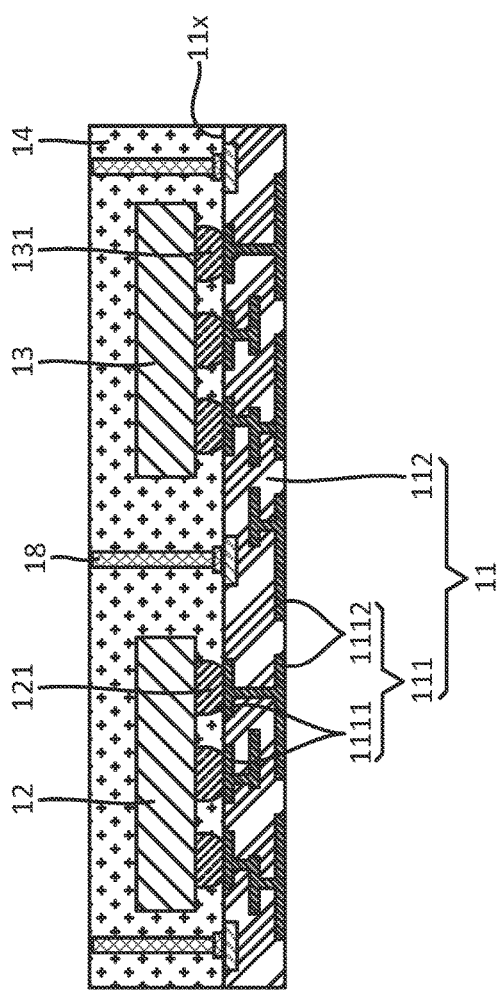
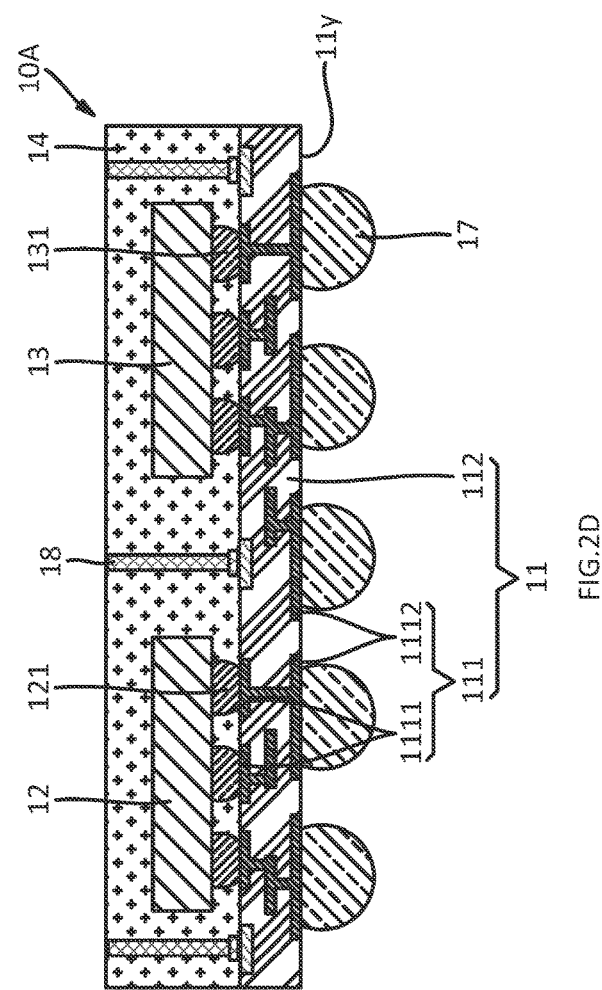
FIG.2C
FIG.2D

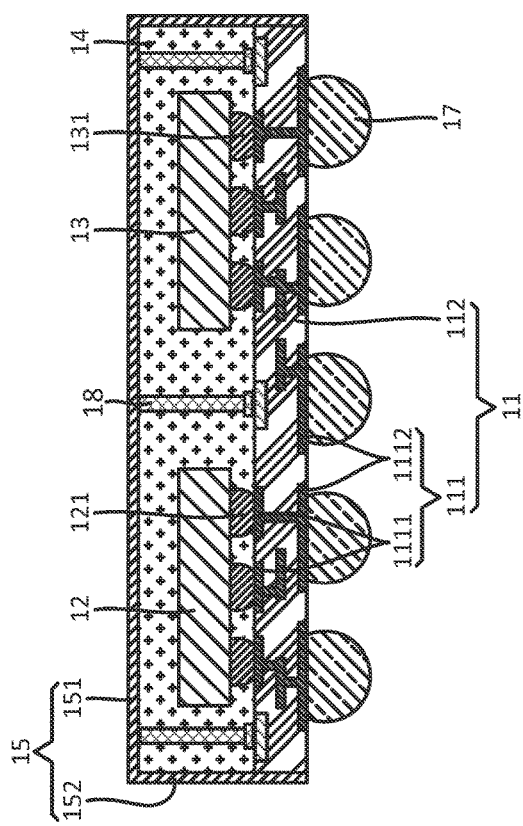
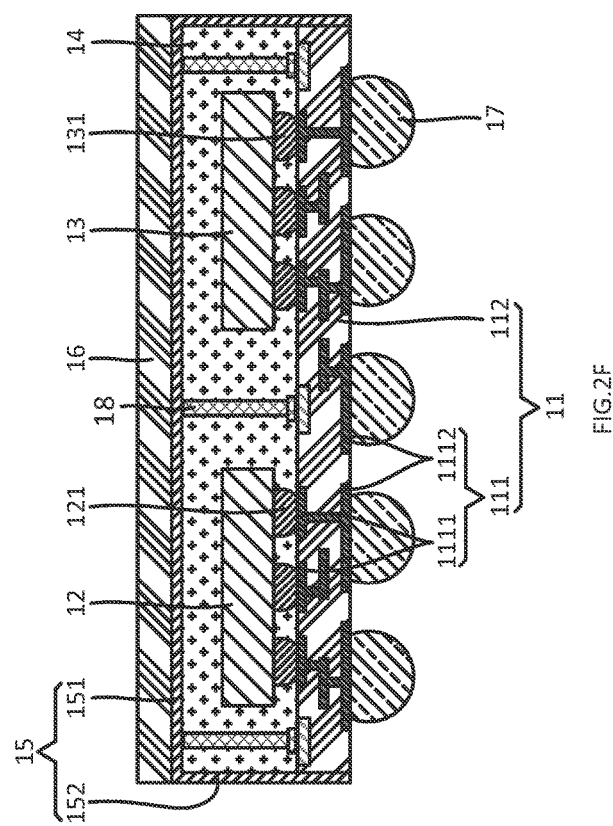
FIG.2E
FIG.2F

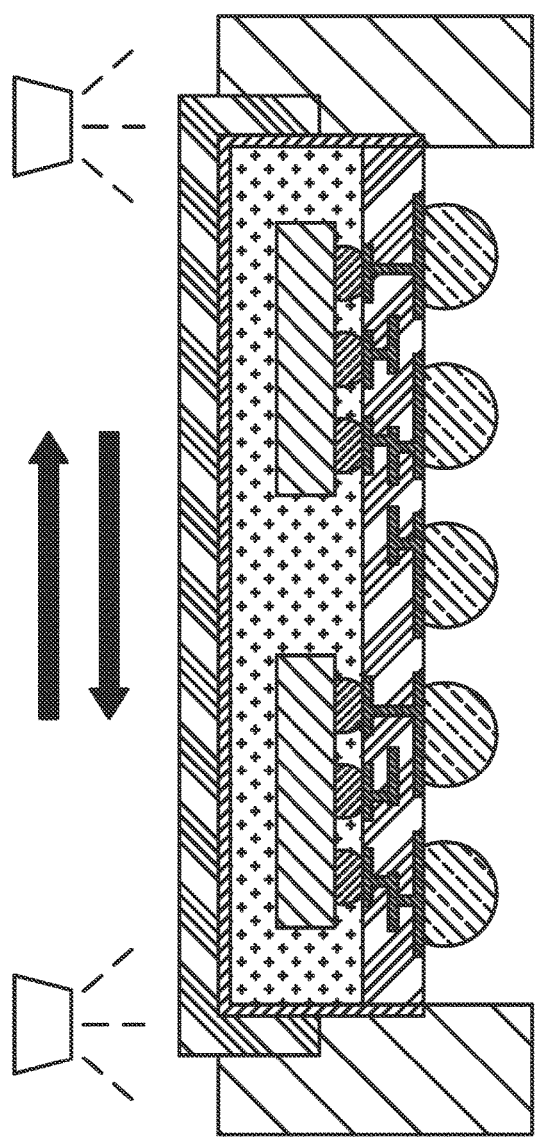
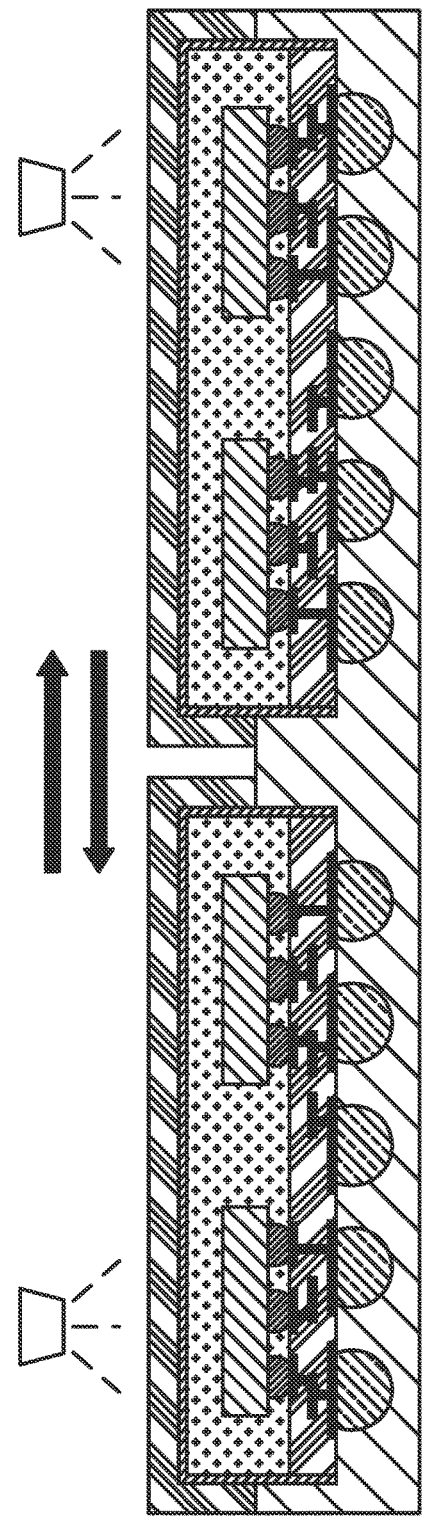
FIG.8A
FIG.8B

ELECTRONIC DEVICES AND METHODS OF MANUFACTURING ELECTRONIC DEVICES

CROSS REFERENCE TO RELATED APPLICATIONS

Not Applicable.

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, and 2F show cross-sectional views of an example method for manufacturing an example electronic device.

FIGS. 8A and 8B show some examples of a method for providing a thin metallic coating shown in FIG. 7.

Figure 1:
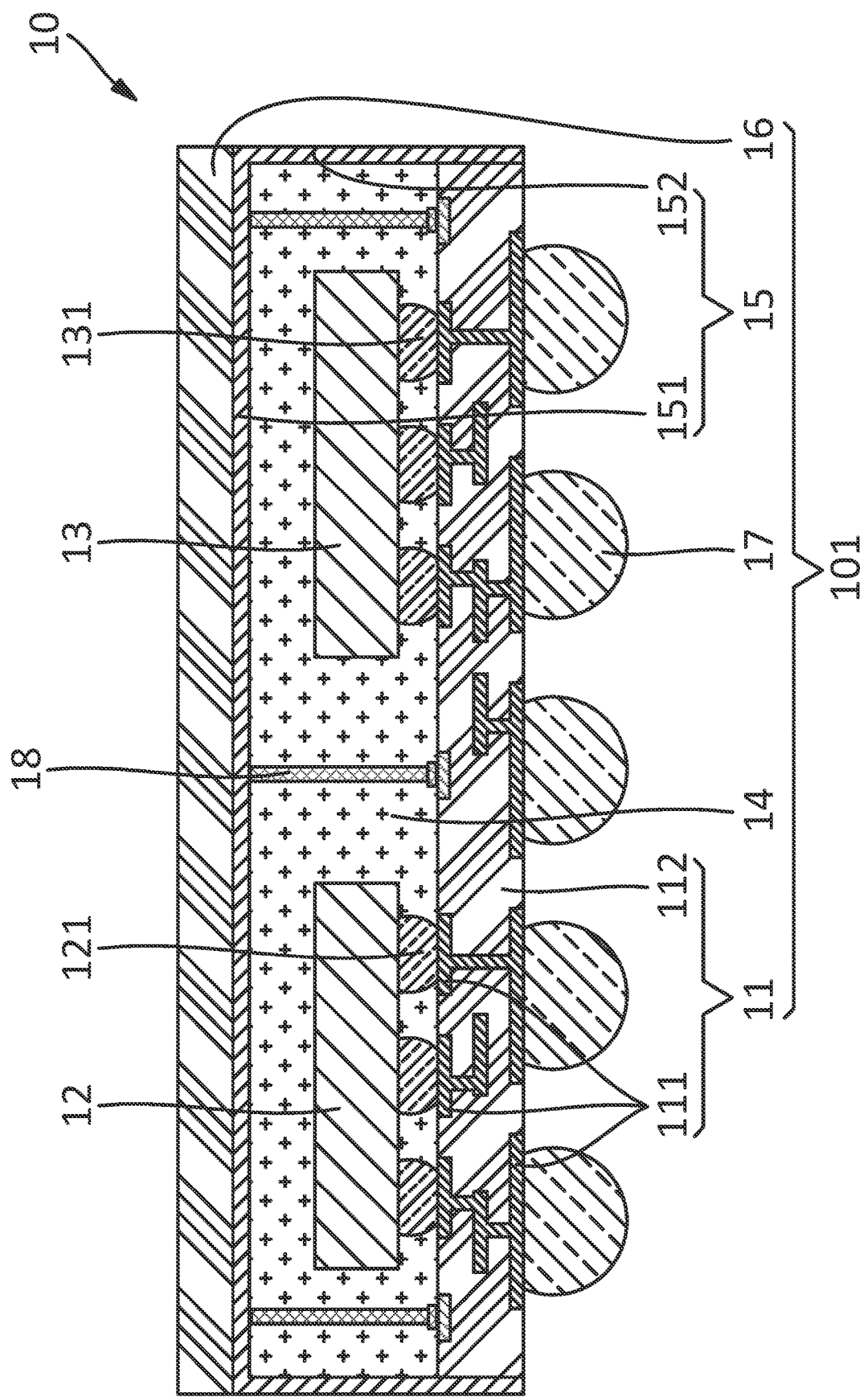
FIG. 1 shows a cross-sectional view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements.

DESCRIPTION

The present description includes, among other features, structures and associated methods that relate to electronic devices including, for example, semiconductor devices configured with an electromagnetic interference (EMI) shield structure and a thermal enhancement structure. In some examples, the EMI shield is a thin conformal conductor and the thermal enhancement structure is a thick conformal conductor. In some examples, the thin conformal conductor is under the thick conformal conductor. In other examples, the thick conformal conductor is under the thin conformal conductor. In some examples, the thin conformal conductor and the thick conformal conductor are formed using different processes or application techniques. Among other things, the structures and methods provide an electronic package with improved performance and reliability by reducing susceptibility to EMI, by improving thermal performance, and buy improving the adhesion between the conformal conductors.

In an example, an electronic device includes a substrate having an upper side, a lower side opposite to the upper side, a lateral side connecting the upper side to the lower side, and a conductive structure. A first electronic component is coupled to the conductive structure at the upper side of the substrate. An encapsulant covers a lateral side of the first electronic component and the upper side of the substrate and having an encapsulant top side and an encapsulant lateral side. The electronic device includes first metallic coating having a first metallic coating top side, a first metallic coating sidewall; and a first metallic coating thickness. The electronic device includes a second metallic coating having a second metallic coating thickness that is greater than the first metallic coating thickness. In accordance with the present example, the first metallic coating top side is over the encapsulant top side, the first metallic coating sidewall is over the encapsulant lateral side, and the second metallic coating is over the encapsulant top side.

In an example, an electronic device includes a substrate comprising a dielectric structure, a conductive structure within the dielectric structure, a substrate upper side, a substrate lower side, and a substrate lateral side. A first electronic component is coupled to the conductive structure at the substrate upper side. An encapsulant covers the first electronic component and the substrate upper side and has an encapsulant top side and an encapsulant lateral side. A first conformal conductor having a first conformal conductor top side and a first conformal conductor sidewall, where the first conformal conductor top side extends over the encapsulant top side, over the encapsulant lateral side, and over the substrate lateral side. A second conformal conductor having a second conformal conductor top side is over the encapsulant top side. In accordance with the present example, the first conformal conductor has a first thickness; the second conformal conductor has a second thickness that is greater than the first thickness; the first conformal conductor is an electronic magnetic interference shield for the electronic device; and the second conformal conductor is a heat sink for the electronic device.

In an example, a method of manufacturing an electronic component includes providing a substrate having an upper side, a lower side opposite to the upper side, a lateral side connecting the upper side to the lower side, and a conductive structure. The method includes coupling a first electronic component to the conductive structure at the upper side of the substrate. The method includes providing an encapsulant covering a lateral side of the first electronic component and the upper side of the substrate and having an encapsulant top side and an encapsulant lateral side. The method includes in either order providing a first metallic coating over the encapsulant top side and the encapsulant lateral side, the first metallic coating having a first metallic coating top side, a first metallic coating sidewall, and a first metallic coating thickness; and providing a second metallic coating over the encapsulant top side. The second metallic coating has a second metallic coating thickness that is greater than the first metallic coating thickness.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 11, electronic components 12 or 13, encapsulant 14, thin metallic coatings 15, thick metallic coating 16, vertical interconnect 18, and external interconnect 17.

Substrate 11 can comprise conductive structure 111 and dielectric structure 112. Electronic components 12 or 13 can comprise component interconnects 121 and 131, respectively. Thin metallic coating 15 can comprise thin coating topside 151 and thin coating sidewall 152.

Thin metallic coating 15 can cover the top of encapsulant 14, and thick metallic coating 16 can cover portions of thin metallic coating 15. In some examples, encapsulant 14 can expose top sides of electronic components 12 or 13, and thin metallic coating 15 can contact such exposed top sides.

Substrate 11, encapsulant 14, external interconnect 17, thin metallic coating 15, and thick metallic coating 16 can comprise or be referred to as electronic package 101 or package 101. Electronic package 101 can protect electronic component 12 or 13 from external elements or environmental exposure. Electronic package 101 can provide electrical coupling between external components or other electronic packages and electronic components 12 or 13.

FIGS. 2A, 2B, 2C, 2D, 2E, and 2F show cross-sectional views of an example method for manufacturing an example electronic device 10.

FIG. 2A shows a cross-sectional view of electronic device 10 at an early stage of manufacture. In the example shown in FIG. 2A, substrate 11 can comprise conductive structure 111 and dielectric structure 112.

In some examples, dielectric structure 112 can comprise or be referred to as one or more dielectric layers. For instance, the one or more dielectric layers can comprise a core layer, one or more polymer layers, one or more pre-preg layers, or one or more solder mask layers stacked on each other. One or more layers or elements of conductive structure 111 can be interposed or embedded between the one or more layers of dielectric structure 112. The upper and lower sides of dielectric structure 112 can be upper side 11x and lower side 11y of substrate 11, respectively. A lateral side connects upper side 11x to lower side 11y. In some examples, dielectric structure 112 can comprise an epoxy resin, a phenolic resin, a glass epoxy, a polyimide, a polyester, an epoxy molding compound, or a ceramic. In some examples, the thickness of dielectric structure 112 can range from approximately 20 μm (micrometers) to 500 μm.

Conductive structure 111 can comprise one or more conductive layers and defines conductive paths with elements such as traces, pads, vias, and wiring patterns. Conductive structure 111 can comprise inward terminals 1111 provided on upper side 11x of dielectric structure 112, outward terminals 1112 provided on lower side 11y of dielectric structure 112, and conductive paths 1113 extending through dielectric structure 112.

Inward terminals 1111 and outward terminals 1112 can be respectively provided on upper side 11x and lower side 11y of dielectric structure 112 in a matrix form having rows or columns, respectively. In some examples, inward terminal 1111 or outward terminal 1112 can comprise or be referred to as a conductor, a conductive material, a substrate land, a conductive land, a substrate pad, a wiring pad, a connection pad, a micro pad, or under-bump-metallurgy (UBM). In some examples, the thicknesses of inward terminal 1111 or outward terminal 1112 can range from approximately 10 μm to 25 μm.

Conductive path 1113 can be routed in dielectric structure 112 to couple inward terminals 1111 with outward terminals 1112. Conductive path 1113 can be defined by portions of one or more conductive layers. In some examples, conductive path 1113 can comprise or be referred to as one or more conductors, conductive material, vias, circuit patterns, traces, or wiring patterns. In some examples, inward terminal 1111, outward terminal 1112, and conductive path 1113 can comprise copper (Cu), iron (Fe), nickel (Ni), gold (Au), silver (Ag), palladium (Pd), or tin (Sn).

In some examples, substrate 11 can comprise or be referred to as a printed circuit board, a multilayer substrate, a laminate substrate, or a molded lead frame. In some examples, substrate 11 can comprise or be referred to as a redistribution layer (RDL) substrate, a buildup substrate, or a coreless substrate. In some examples, substrate 11 can have an area varying according to the area of electronic component 12, and can have an area of approximately 2 mm (millimeter)×2 mm to approximately 50 mm×50 mm. In some examples, substrate 11 can have a thickness varying according to the thickness of electronic component 12 and can have a thickness of approximately 0.05 mm to approximately 2 mm.

In some examples, substrate 11 can be a an RDL substrate. RDL substrates can comprise one or more conductive redistribution layers and one or more dielectric layers and (a) can be formed layer by layer over an electronic device to where the RDL substrate is to be coupled, or (b) can be formed layer by layer over a carrier and can be entirely removed or at least partially removed after the electronic device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or SiON. The inorganic dielectric layer(s) can be formed by growing the inorganic dielectric layers using an oxidation or nitridization process instead of using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Other substrates in this disclosure can also comprise an RDL substrate.

In some examples, substrate 11 can be a pre-formed substrate. The pre-formed substrate can be manufactured prior to attachment to an electronic device and can comprise dielectric layers between respective conductive layers. The conductive layers can comprise copper and can be formed using an electroplating process. The dielectric layers can be relatively thicker non-photo-definable layers and can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate and omits the permanent core structure, and the dielectric and conductive layers can be formed on a sacrificial carrier and is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process. Other substrates in this disclosure can also comprise a pre-formed substrate.

FIG. 2B shows a cross-sectional view of electronic device 10 at a later stage of manufacture. In the example shown in FIG. 2B, electronic components 12 or 13 can be provided on substrate 11, coupled with inward terminals 1111. Optionally, vertical interconnects 18 can be provided on substrate 11, coupled with respective inward terminals 1111 or other terminals.

In some examples, pick-and-place equipment can pick up electronic components 12 or 13 and place them on upper side 11x of substrate 11. In some examples, electronic components 12 or 13 can be secured to inward terminal 1111 of substrate 11 through mass reflow, thermal compression, or laser assisted bonding. In some examples, electronic components 12 or 13 can be configured for coupling with inward terminals 1111 by wirebonding or other interconnection structures as known to one of ordinary skill in the art. In some examples, electronic components 12 or 13 can comprise or be referred to as one or more semiconductor dies, semiconductor chips, or semiconductor packages. Although two electronic components 12 and 13 are illustrated, the number of electronic components can be less or more than two. As an example, electronic components 12 or 13 can comprise passive or active devices.

Electronic components 12 or 13 can comprise component interconnects 121 and 131, respectively. Component interconnects 121 and 131 can be provided spaced apart from each other in row or column directions. In some examples, component interconnects 121 and 131 can comprise or be referred to as a pad, a bump, a pillar, a conductive post, or a solder ball. In some examples, component interconnects 121 or 131 can represent wirebond connections from atop side of components 12 or 13 to inward terminals 1111 of substrate 11. Component interconnects 121 and 131 can comprise a conductive material such as aluminum (Al), copper, aluminum alloy, or a copper alloy. Component interconnects 121 and 131 can be input/output terminals or power terminals of electronic components 12 or 13, respectively.

Component interconnects 121 and 131 can comprise a low-melting-point material and can be coupled to inward terminal 1111 of substrate 11. As an example, the low-melting-point material can comprise one or more of Sn, Ag, lead (Pb), Cu, Sn=Pb, Sn37-Pb, Sn95-Pb, Sn—Pb—Ag, Sn—Cu, Sn—Ag, Sn—Au, Sn-bismuth (Bi), or Sn—Ag—Cu. Component interconnects 121 and 131 can be coupled to inward terminal 1111 of substrate 11 through the low-melting-point material. In some examples the overall thickness of electronic components 12 or 13 can range from approximately 50 µm to 800 µm, or their respective area can range from approximately 0.5 mm×0.5 mm to approximately 40 mm×40 mm. In some examples, the width or height of component interconnects 121 and 131 can range from approximately 10 µm to 80 µm, or the pitch can range from approximately 20 µm to 15 µm.

Optionally, vertical interconnects 18 can be provided over substrate 11. Vertical interconnects 18 can be configured to carry one or more voltages, such as a power voltage, a ground voltage, or a common voltage, between either or both of and thin metallic coatings 15 or thick metallic coating 16 and substrate 11. In some examples, vertical interconnects 18 can be configured to define one or more EMI shielding compartments of electronic device 10. For instance, vertical interconnects 18 extending between electronic components 12 or 13 can define separate boundaries of respective EMI compartments or shielding between electronic components 12 or 13. In some implementations, several vertical interconnects 18 can be aligned in rows, such as rows extending in the "Z"-axis into the page of FIG. 1, to define compartment boundaries. In some examples, vertical interconnects 18 can comprise vertical wirebonds, or vertical pillars. In some examples, vertical interconnects 18 can be provided by wirebonding, plating, or soldering.

Although electronic components 12 or 13 are shown coupled to inward terminals 1111 face-down or in a flip-chip configuration, there can be examples where electronic components 12 or 13 can be coupled to inward terminals 1111 face-up or in a wirebond or other interconnect configurations.

FIG. 2C shows a cross-sectional view of electronic device 10 at a later stage of manufacture. In the example shown in FIG. 2C, encapsulant 14 can be provided to cover upper side 11x of substrate 11 and electronic components 12 or 13. In some examples, encapsulant 14 can be in contact with top side of substrate 11, and top and lateral sides of electronic components 12 or 13. In some examples, encapsulant 14 can cover the lateral sides of components 12 or 13 but can expose the top sides of electronic components 12 or 13.

In some examples, encapsulant 14 can comprise or be referred to as a body, a molding, or a lid. In some examples, when encapsulant 14 is a molding, encapsulant 14 can comprise an organic resin, an inorganic filler, a curing agent, a catalyst, a coupling agent, a colorant, or a flame retardant, and can be formed by compression molding, transfer molding, liquid encapsulant molding, vacuum lamination, paste printing, or film assist molding. In some examples, encapsulant 14 can initially cover the top sides of electronic components 12 or 13, or the top sides of vertical interconnects 18, and can then be grinded or thinned to expose such top sides. In some examples, portions of the top sides of electronic components 12 or 13, or of vertical interconnects 18, can also be thinned, such as while encapsulant 14 is grinded, to decrease the height of electronic components 12 or 13 or of vertical interconnects 18.

In some examples, when encapsulant 14 is a lid, encapsulant 14 can be fixed to the top side of substrate 11 through an adhesive. In some examples, an area of encapsulant 14 can substantially correspond to an area of substrate 11. In some examples, the thickness of encapsulant 14 can range from approximately 0.1 mm to 1 mm. Encapsulant 14 can protect substrate 11 and electronic component 12 or 13 from external elements.

FIG. 2D shows a cross-sectional view of electronic device 10 at a later stage of manufacture. In the example shown in FIG. 2D, external terminals 17 can be provided coupled to outward terminals 1112 of substrate 11.

In some examples, external terminal 17 can be coupled to electronic components 12 or 13 through conductive structure 111 of substrate 11. Electronic components 12 or 13 can be coupled to external terminals 17 through substrate 11. In some examples, external terminal 17 can comprise Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. For example, external terminal 17 can be formed through a reflow process after forming a conductive material including solder on the lower side of outward terminal 1112 of substrate 11 through a ball drop method. External terminal 17 can comprise or be referred to as a conductive ball such as a solder ball, a conductive pillar such as a copper pillar, or a conductive post having a solder cap formed on the copper pillar. In some examples, the width or height of external terminal 17 can range from approximately 50 µm to 250 µm. In some examples, external terminal 17 can comprise or be referred to as an external input/output terminal of electronic device 10.

In some examples, a singulation process of separating substrate 11 into individual electronic devices 10A can be performed by sawing through substrate 11 and encapsulant 13. Individual electronic device 10A can comprise substrate 11, electronic components 12 or 13, encapsulant 14, and external terminal 17.

FIG. 2E shows a cross-sectional view of electronic device 10 at a later stage of manufacture. In the example shown in FIG. 2E, thin metallic coating 15 can be provided to cover the top and lateral sides of individual electronic device 10A. Thin metallic coating 15 can contact the top and lateral sides of encapsulant 14 and the lateral side of substrate 11. In examples where encapsulant 14 exposes the top sides of electronic components 12 or 13, or the top sides of vertical interconnects 18, thin metallic coating 15 can contact such top sides. Thin metallic coating 15 can comprise one or more metallic layers. Thin metallic coating 15 can comprise thin coating topside 151 covering the top side of individual electronic device 10A, and thin coating sidewall 152 covering the lateral side of individual electronic device 10A. Thin coating sidewall 152 is continuous with thin coating topside 151 and extends downward from edges of thin coating topside 151. Thin coating topside 151 can contact the top side of encapsulant 14, and thin coating sidewall 152 can contact the lateral sides of encapsulant 14 and the lateral sides of substrate 11.

In some examples, thin coating sidewall 152 can be in contact with conductive structure 111 of substrate 11. In some examples, conductive structure 111 in contact with thin coating sidewall 152 can comprise or be referred to as a ground lead, ground pad or ground terminal. Thin metallic coating 15 can be made of a conductive material to shield electromagnetic interference to or from electronic components 12 or 13. In some examples, thin metallic coating 15 can be a conformal coating that is applied and conforms to the contours of encapsulant 14 and substrate 11, and then solidifies. In some examples, thin metallic coating 15 can comprise or be referred to as conformal shield, conformal conductor, lid, shield or EMI shield. In some examples, thin metallic coating 15 can comprise Ni, Pd, Cu, stainless steel (SUS), Au, or Al. In some examples, thin metallic coating 15 can be formed by sputtering, printing, coating, spraying, or plating. The thickness of thin coating topside 151 can be similar to the thickness of thin coating sidewall 152. In some examples, the thickness of thin coating topside 151 can be approximately 3 μm to 5 μm and the thickness of thin coating sidewall 152 can be approximately 2 μm to 3 μm.

Figure 5A:
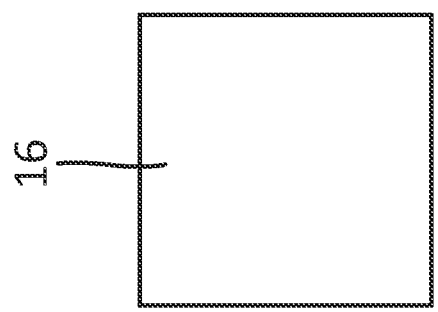
FIGS. 5(A), 5(B), 5(C), 5(D), 5(E), 5(F), 5(G), and 5(H) show example top views of the electronic device shown in FIG. 2F and FIG. 4.

FIG. 2F shows a cross-sectional view of electronic device 10 at a later stage of manufacture. In the example shown in FIG. 2F, thick metallic coating 16 can be provided to cover a top side of thin coating topside 151. Thick metallic coating 16 can be provided with a uniform thickness so as to cover the entire upper side of thin coating topside 151. This is further shown in FIG. 5(A). Thick metallic coating 16 can comprise one or more metallic layers and can be in contact with thin coating topside 151. In some examples, thick metallic coating 16 can be a conformal coating that is applied and conforms to the contours coating topside 151, and then solidifies. In some examples, thick metallic coating 16 can be referred to as or comprise a conformal conductor, a conformal heat sink, a lid or a heat sink.

Figure 3A:
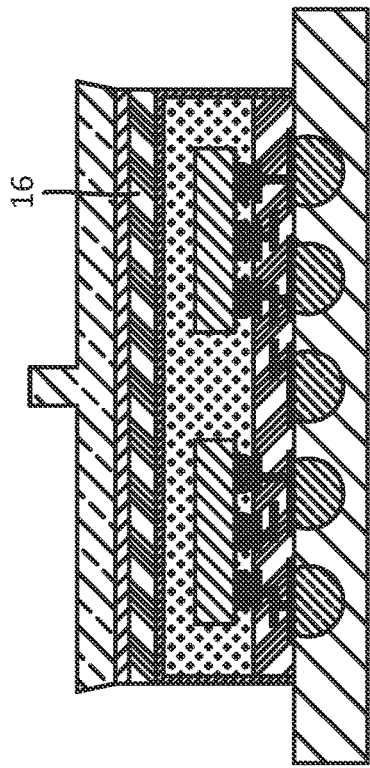
FIGS. 3A, 3B, and 3C show some examples of the method for providing a thin metallic coating shown in FIG. 2F.

In some examples, such as shown in FIG. 3A, after fixing electronic device 10 by using a jig, thick metallic coating 16 can be provided on thin coating topside 151 by spraying, dispensing, deposition or screen printing. The jig can expose thin coating topside 151 while covering the lateral sides of electronic device 10.

Figure 3B:
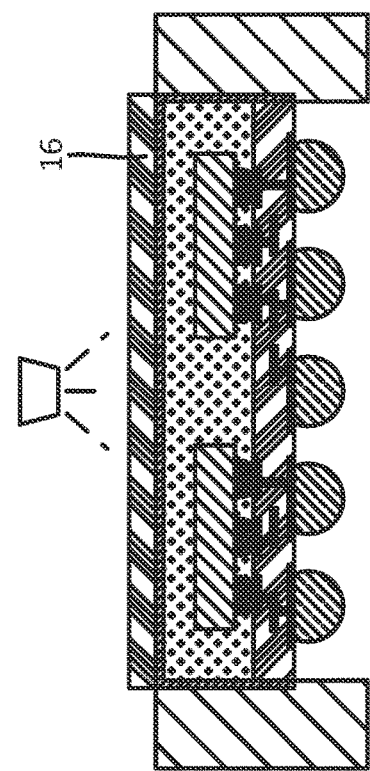

In some examples, such as shown in FIG. 3B, thick metallic coating 16 is in the form of a metallic film or foil. After fixing electronic device 10 by using a frame with tape, thick metallic coating 16 can be picked up by pick-and-place equipment to then be aligned and placed on thin coating topside 151. The frame with the tape can be adhered to the lower side of the electronic device 10 to fix the electronic device 10. Subsequently, thick metallic coating 16 can be adhered and fixed to the thin coating topside 151 by an adhesive. Here, the adhesive can be applied on the lower side of thick metallic coating 16 or on the upper side of thin coating topside 151.

Figure 3C:
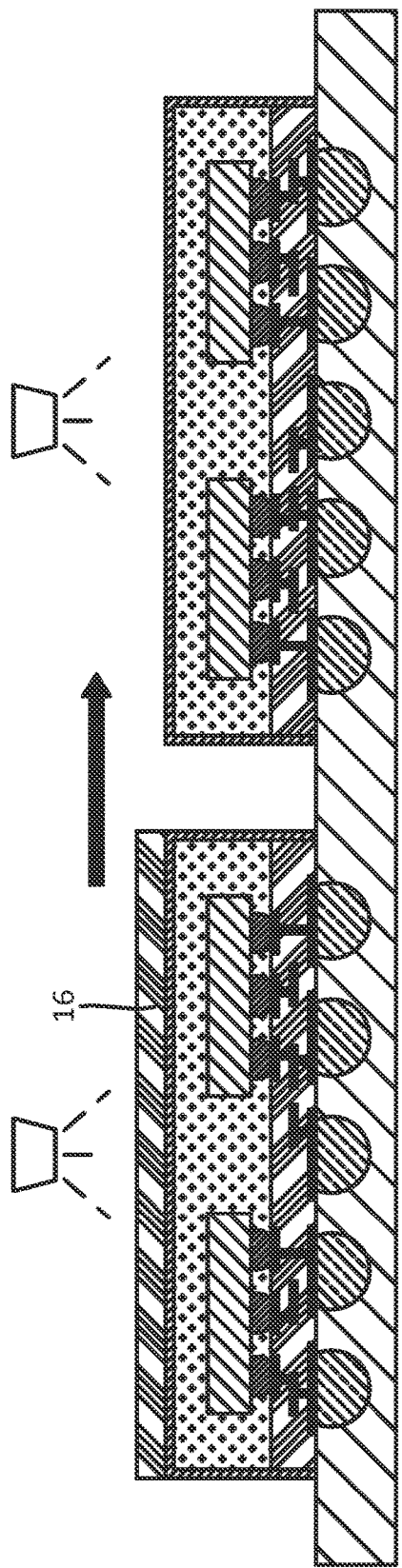

In some examples, such as shown in FIG. 3C, after fixing electronic device 10 by using a frame with tape, thick metallic coating 16 can be provided on thin coating topside 151 by spraying, dispensing, deposition or screen printing. Two or more electronic devices 10 can be arranged on a frame with a tape so as to be spaced apart from each other in one direction, and thick metallic coating 16 can be provided on the upper side of each of electronic devices 10 by selectively applying metallic material on thin coating topside 151 as the nozzle moves. The frame with the tape can be adhered to the lower side of the electronic device 10 to fix the electronic device 10.

In some examples, thick metallic coating 16 can be made of a metal material having high thermal conductivity to facilitate heat dissipation. For example, thick metallic coating 16 can comprise Al, Ag, SUS, Cu, or Ni. In some examples, an area of thick metallic coating 16 can substantially correspond to an area of thin coating topside 151. The thickness of thick metallic coating 16 can be thicker than 5 times the thickness of thin metallic coating 15 to enhance heat conduction or dissipation performance. In some examples, the thickness of thick metallic coating 16 can be approximately 20 μm to 50 μm.

Completed electronic device 10 can comprise substrate 11, electronic component 12 or 13, encapsulant 14, thin metallic coating 15, thick metallic coating 16, and external interconnects 17. Electronic device 10 can comprise thin metallic coating 15 having a smaller thickness covering the sidewall and the upper side, and can comprise thick metallic coating 16 having a larger thickness covering the upper side of electronic device 10. Electronic device 10 can provide EMI shielding via thin metallic coating 15, and can provide enhanced heat dissipation via thick metallic coating 16.

Figure 4:
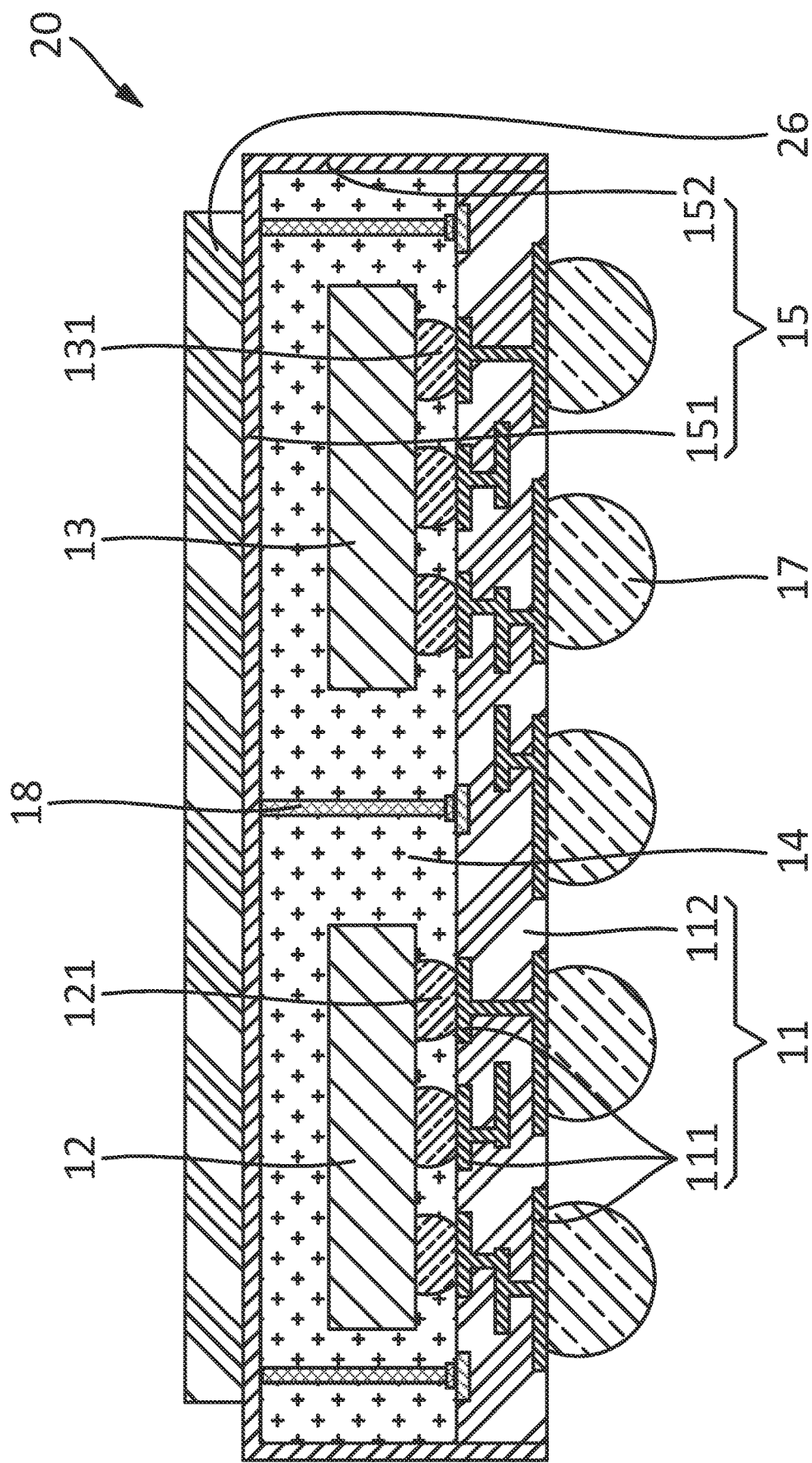
FIG. 4 shows a cross-sectional view of an example electronic device.

FIG. 4 shows a cross-sectional view of an example electronic device 20. In the example shown in FIG. 4, electronic device 20 can comprise substrate 11, electronic components 12 or 13, vertical interconnects 18, encapsulant 14, external interconnect 17 thin metallic coating 15, and thick metallic coating 26. Electronic device 20 can be similar to previously described electronic device 10. Electronic substrate 11, electronic components 12 or 13, encapsulant 14, external interconnect 17 and thin metallic coating 15 of electronic device 20 can be similar to corresponding elements of electronic device 10. In the present example, thick metallic coating 26 can have a smaller area compared to thin coating topside 151 of thin metallic coating 15. A portion of the top side of thin coating topside 151 can be exposed from thick metallic coating 26. In some examples, the area of thick metallic coating 26 can be approximately 2×2 mm to approximately 11×11 mm.

Figure 5B:
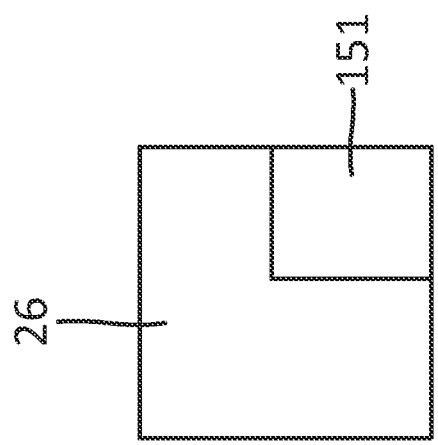

In some examples, such as shown in FIG. 5(B), thick metallic coating 26 can be provided to cover a portion of thin coating topside 151. Thick metallic coating 26 can expose some regions along the edges of thin coating topside 151. Thick metallic coating 26 can expose at least one side edge of thin coating topside 151. Thick metallic coating 26 can vary shapes of regions that expose thin coating topside 151 in various manners.

Figure 5C:
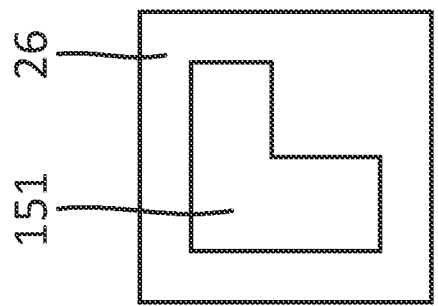
Figure 5D:
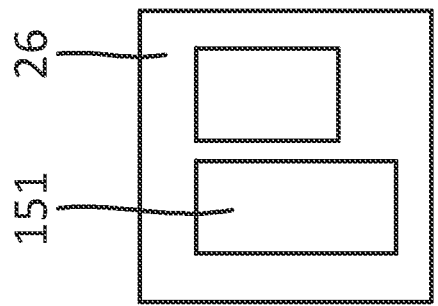
Figure 5E:
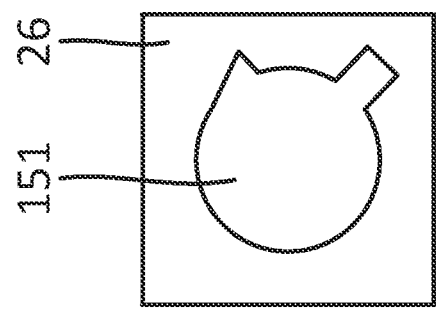

In some examples, such as shown in FIG. 5(C) and FIG. 5(E), thick metallic coating 26 can expose some regions of the center of thin coating topside 151. Thick metallic coating 26 can cover the entire edge region of thin coating topside 151, and the shapes of the regions that expose the central regions can vary in different manners, such as to correspond to one or more locations of hot spots or components of the electronic device.

Figure 5F:
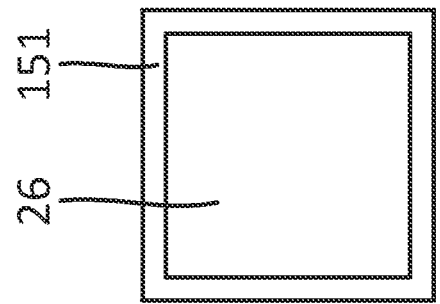
Figure 5G:
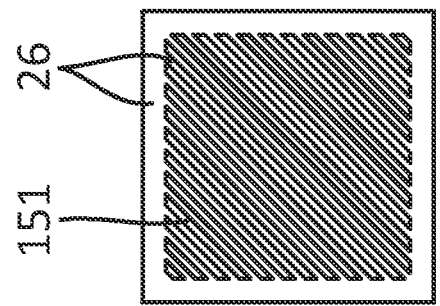

In some examples, such as shown in FIG. 5(D) and FIG. 5(G), thick metallic coating 26 can expose portions of the center region of thin coating topside 151, and the exposed region can be divided into more than one partitions. Thick metallic coating 26 can entirely cover an edge region of thin coating topside 151. Metallic coating 26 can be arranged to define slits or trenches that expose portions of thin coating topside 151, and the shape, direction or number of the slits or trenches can be varied in different manners.

In some examples, such as shown in FIG. 5(F), thick metallic coating 26 can be provided to cover the center of thin coating topside 151, thereby exposing an edge region of thin coating topside 151. In some examples, thick metallic coating 26 can have various patterns.

Figure 5H:
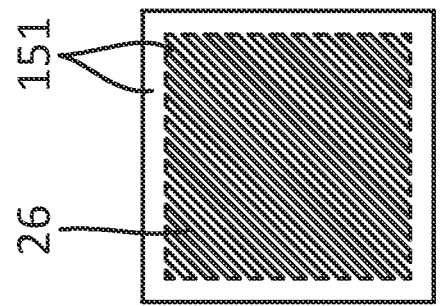

In some examples, such as shown in FIG. 5(H), thick metallic coating 26 can be partitioned into fins or protrusions that expose portions of a center region or of the edge region of thin coating topside 151. Metallic coating 26 can be arranged to define fins or protrusions that cover portions of thin coating topside 151, and the shape, direction or number of the fins or protrusions can be varied in different manners.

Figure 6A:
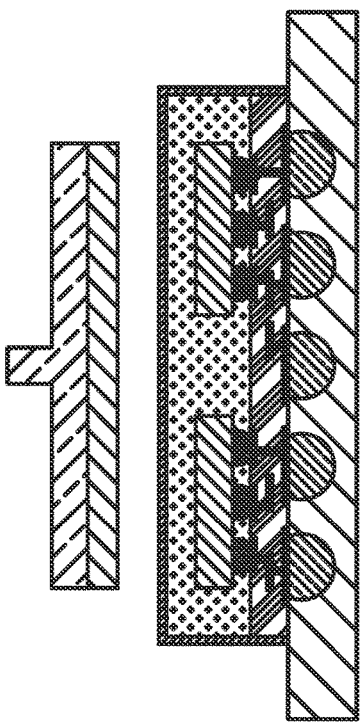
FIGS. 6A, 6B, and 6C show some examples of a method for providing a thin metallic coating shown in FIG. 4.
Figure 6B:
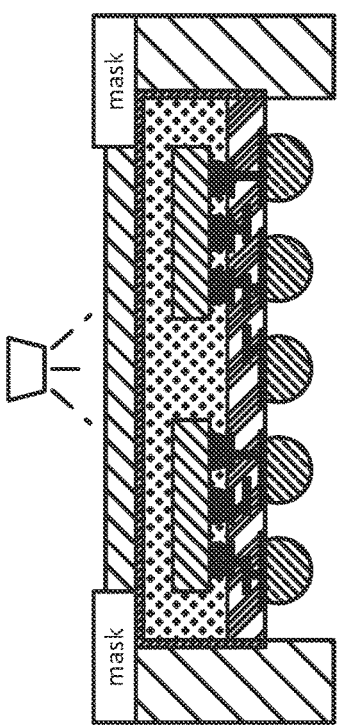
Figure 6C:
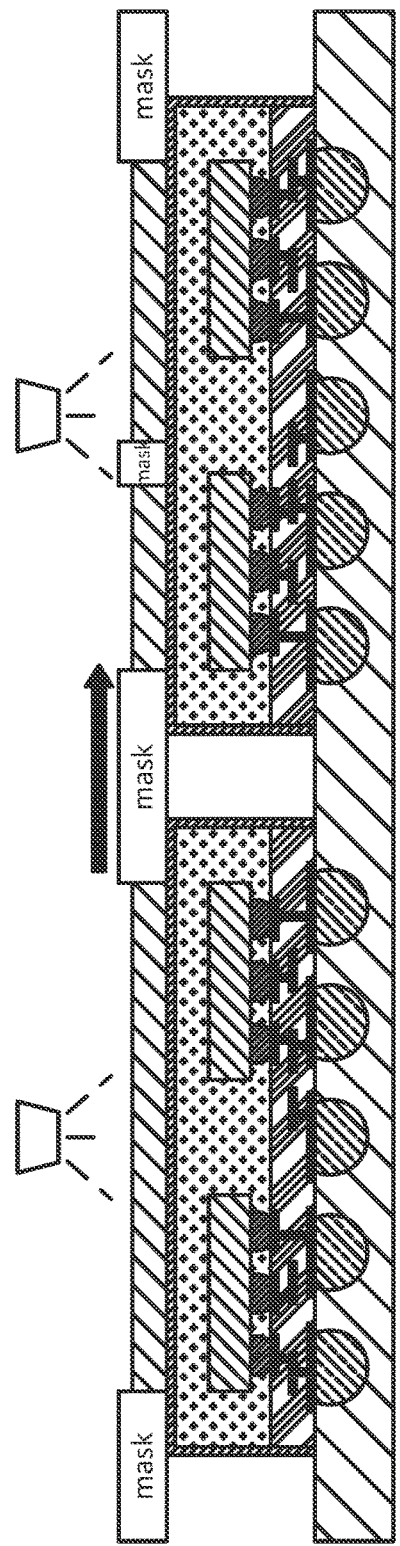

The methods of manufacturing thick metallic coating 26 can be similar to the methods of manufacturing of thick metallic coating 16 shown in FIGS. 3A, 3B and 3C. As shown in FIG. 6A and FIG. 6C, after forming a mask pattern to cover a portion of the upper side of thin coating topside 151, thick metallic coating 26 can be provided by spraying, dispensing, deposition or screen printing. As shown in FIG. 6B, thick metallic coating 26 is in the form of a metallic film having a pattern and can be attached on thin coating topside 151.

Figure 7:
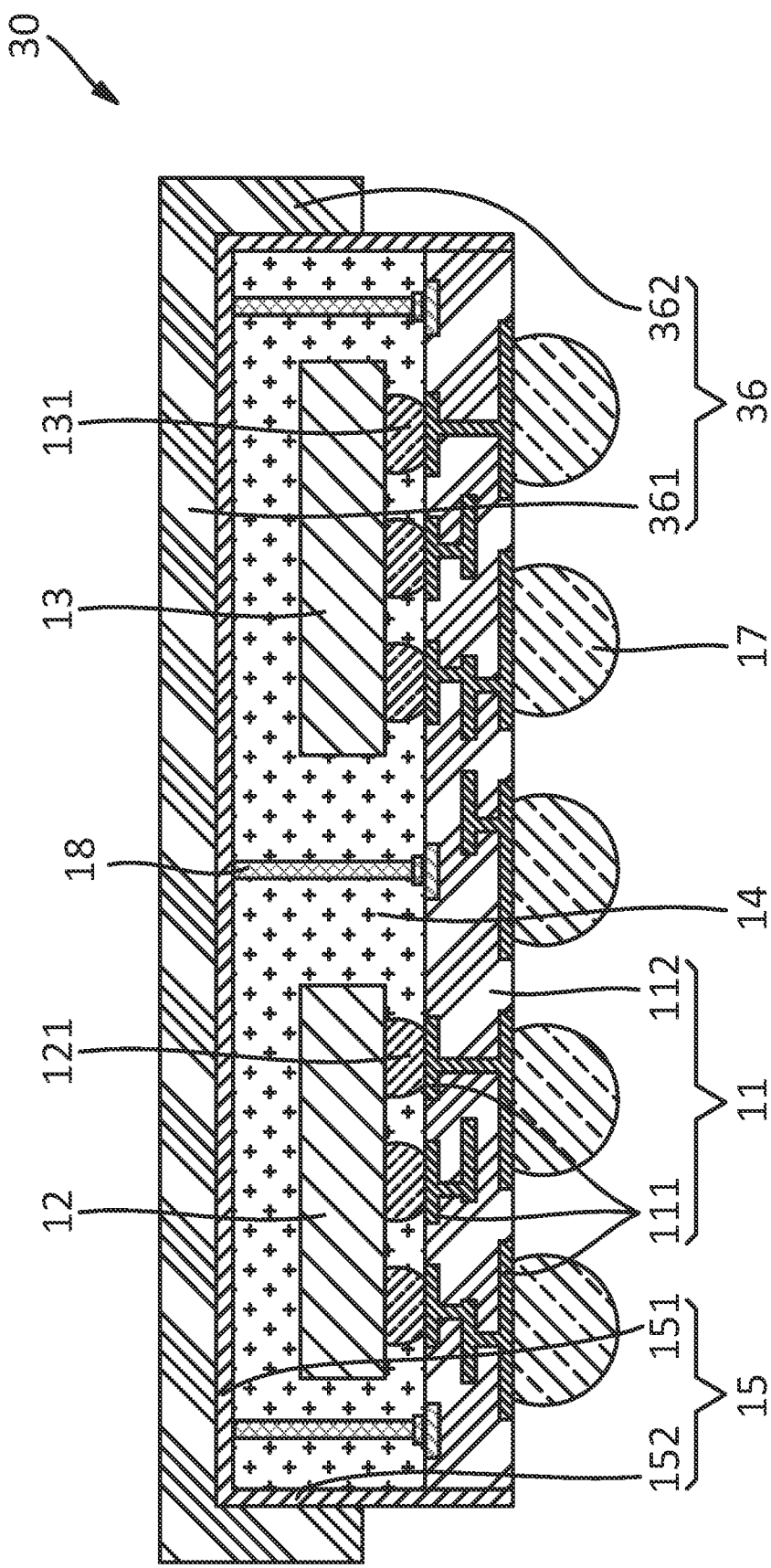
FIG. 7 shows a cross-sectional view of an example electronic device.

FIG. 7 shows a cross-sectional view of an example electronic device 30. In the example shown in FIG. 7, electronic device 30 can comprise substrate 11, electronic components 12 or 13, encapsulant 14, metallic coatings 15 and 36, and external interconnect 17. Electronic device 30 can be similar to previously described electronic device 10. Electronic substrate 11, electronic components 12 or 13, encapsulant 14, external interconnect 17 and thin metallic coating 15 of electronic device 30 can be similar to corresponding elements of electronic device 10.

In the present example, thick metallic coating 36 can comprise thick coating topside 361 covering thin coating topside 151 and thick coating sidewall 362 covering thin coating sidewall 152. Thick coating sidewall 362 can extend downwardly from the edge of thick coating topside 361. In some examples, thick coating sidewall 362 can cover the upper region of thin coating sidewall 152 while exposing the lower region of thin coating sidewall 152. For example, thick coating sidewall 362 can expose a region of thin coating sidewall 152 that covers the lateral sides of substrate 11. In some examples, thick metallic coating 36 can be formed to a uniform thickness.

In some examples, thick coating topside 361 can have an area equal to or smaller than thin coating topside 151 of thin metallic coating 15. Thick coating topside 361 can comprise corresponding elements, features, or methods of fabrication similar thick metallic coating 16 or thick metallic coating 26.

The methods of manufacturing thick metallic coating 36 can be similar to the methods of manufacturing of thick metallic coating 16 shown in FIGS. 3A and 3C. As shown in FIGS. 8A and 8B, a jig of a frame with tape can cover lower portions of the lateral sides and the lower side of electronic device 30. In electronic device 30, the upper side and upper portions of lateral sides of electronic device 30 can be exposed through the jig or frame with tape. Thick metallic coating 36 can be provided to the exposed upper side and lateral sides of electronic device 30 by spraying, dispensing, deposition or screen printing. In electronic device 30, the upper side of thin coating topside 151 can be covered by thick coating topside 361, and an upper region of thin coating sidewall 152 can be covered by thick coating sidewall 362.

Figure 9:
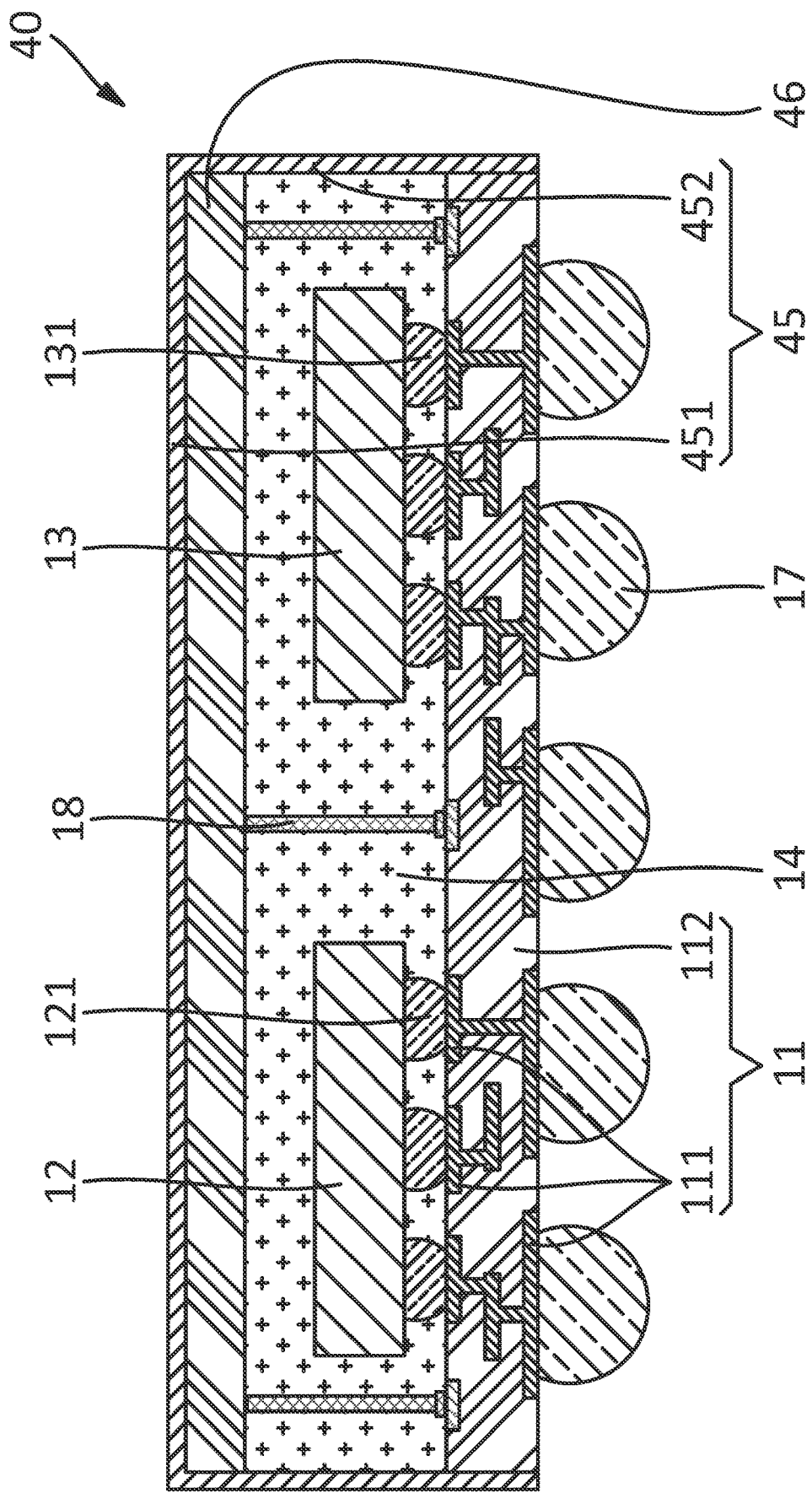
FIGS. 9, 9A, 9B, and 9C show cross-sectional views of example electronic devices.

FIG. 9 shows a cross-sectional view of an example electronic device 40. In the example shown in FIG. 9, electronic device 40 can comprise substrate 11, electronic components 12 or 13, encapsulant 14, thin metallic coating 45, metallic coating 46, vertical interconnects 18, and external interconnect 17. Electronic device 40 can be similar to previously described electronic device 10. Electronic substrate 11, electronic components 12 or 13, encapsulant 14, vertical interconnects 18, and external interconnect 17 of electronic device 40 can be similar to corresponding elements of electronic device 10.

Metallic coating 46 can cover the top of encapsulant 14, and thin metallic coating 45 can cover portions of metallic coating 46. In some examples, encapsulant 14 can expose top sides of electronic components 12 or 13 and top sides of vertical interconnects 18, and metallic coating 46 can contact such exposed top sides.

In some examples, metallic coating 46 can serve as a heat sink as described with respect to thick metallic coating 16. In some examples, metallic coating 46 can be referred to as adhesion metallic coating 46 and can serve as an adhesion promoter for increasing adhesion of thin metallic coating 45 to the top side of encapsulant 14, or to the top sides of electronic components 12 or 13 in examples where they are exposed by encapsulant 14. Metallic coating 46 can be similar to thick metallic coating 16 of electronic device 10, and can comprise similar materials, function, or method of manufacture. For instance, metallic coating 46 can comprise a silver material, can comprise a sprayed material, such as a sprayed silver material, or can comprise a thickness ranging from approximately 3 µm to approximately 5 µm.

In the present example, metallic coating 46 can be interposed between thin coating topside 451 of thin metallic coating 45 and encapsulant 14. Thin metallic coating 45 can comprise thin coating topside 451 covering the upper side of metallic coating 46 and thin coating sidewall 452 extending downward from the edge of thin coating topside 451.

Figure 9A:
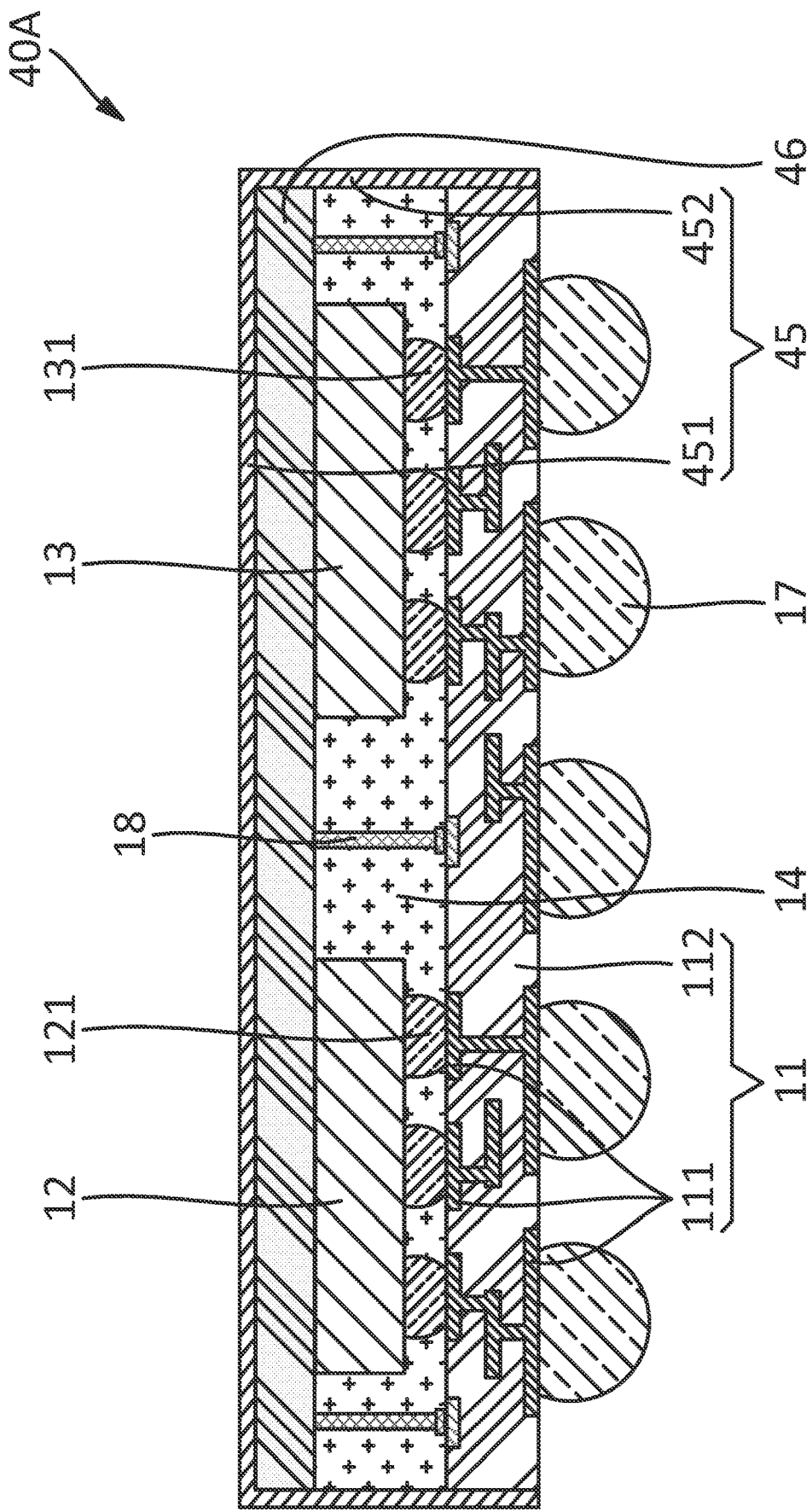

FIG. 9A shows a cross-sectional view of electronic device 40A. In the example shown in FIG. 9A, electronic device 40A is similar to electronic device 40 of FIG. 9, where encapsulant 14 exposes top sides of electronic components 12 or 13 and top sides of vertical interconnects 18, and metallic coating 46 can contact such exposed top sides.

In some examples, electronic device 40A can be provided by a method of manufacturing similar to that described below with respect to FIGS. 10A to 10B, with top sides of electronic components 12 or 13 and top sides of vertical interconnects 18 exposed by encapsulant 14. For instance, metallic coating 46 can be provided similar to as described below with respect to FIG. 10A, such as by spraying, and thin metallic coating 45 can then be provided similar to as described below with respect to FIG. 10B, such as by sputtering.

Figure 9B:
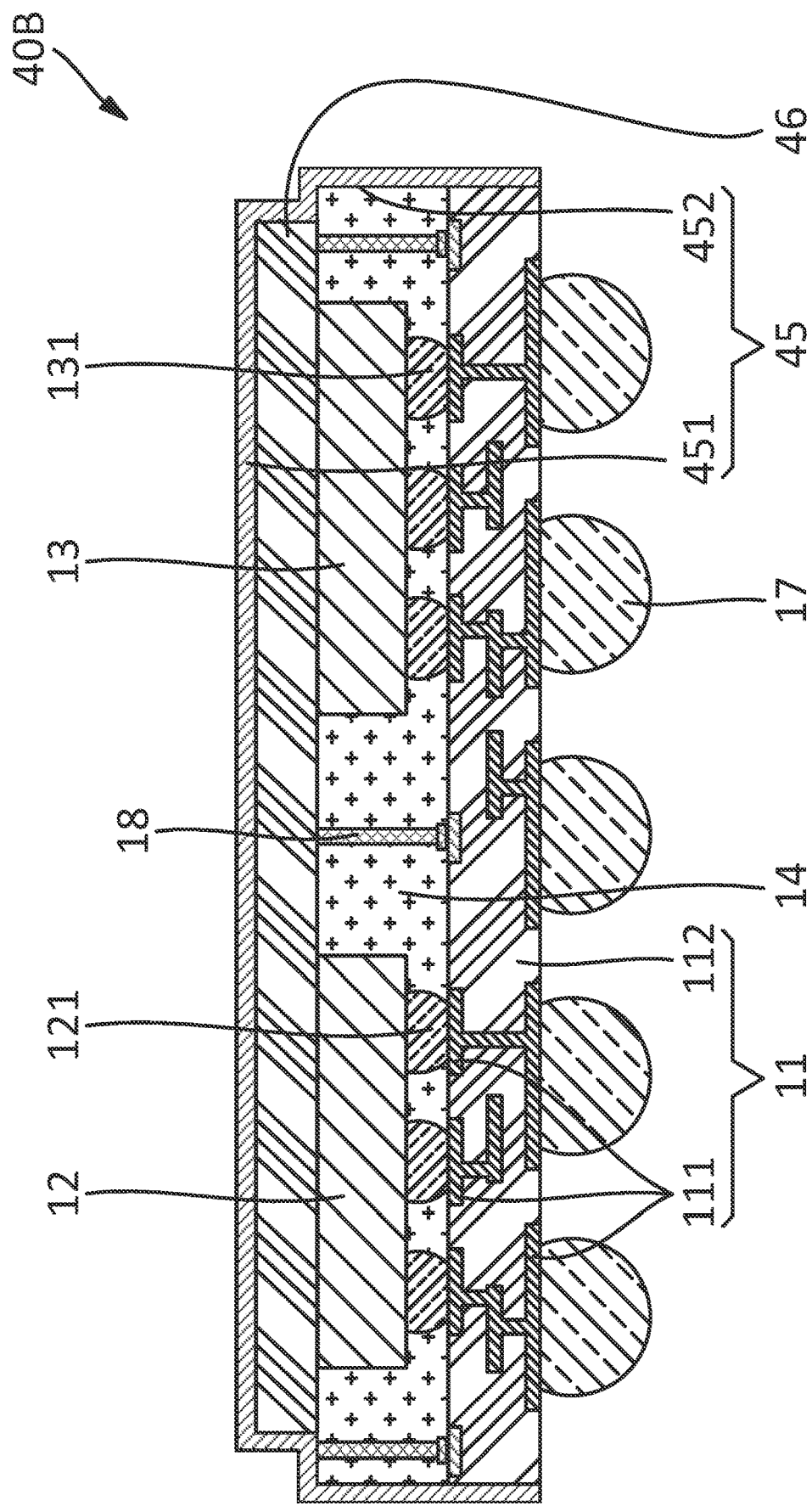

FIG. 9B shows a cross-sectional view of electronic device 40B. In the example shown in FIG. 9B, electronic device 40B can be similar to electronic device 40 of FIG. 9 or electronic device 20 of FIG. 4. Encapsulant 14 exposes top sides of electronic components 12 or 13 and top sides of vertical interconnects 18. Metallic coating 46 can cover portions of the top side of encapsulant 14, leaving other portions exposed. Metallic coating 46 can contact exposed top sides of electronic components 12 or 13 or exposed top sides of vertical interconnects 18. Coating topside 451 of thin metallic coating 45 can cover the top side and lateral sides of metallic coating 46, and the portions of the top side of encapsulant 14 left exposed by metallic coating 46. Coating topside 451 can contact one or more exposed top sides of vertical interconnects 18.

In some examples, electronic device 40B can be provided by a method of manufacturing similar to that described below with respect to FIGS. 10A to 10B, with top sides of electronic components 12 or 13 and top sides of vertical interconnects 18 exposed by encapsulant 14. For instance, metallic coating 46 can be provided similar to as described below with respect to FIG. 10A, such as by spraying, and thin metallic coating 45 can then be provided similar to as described below with respect to FIG. 10B, such as by sputtering.

Figure 9C:
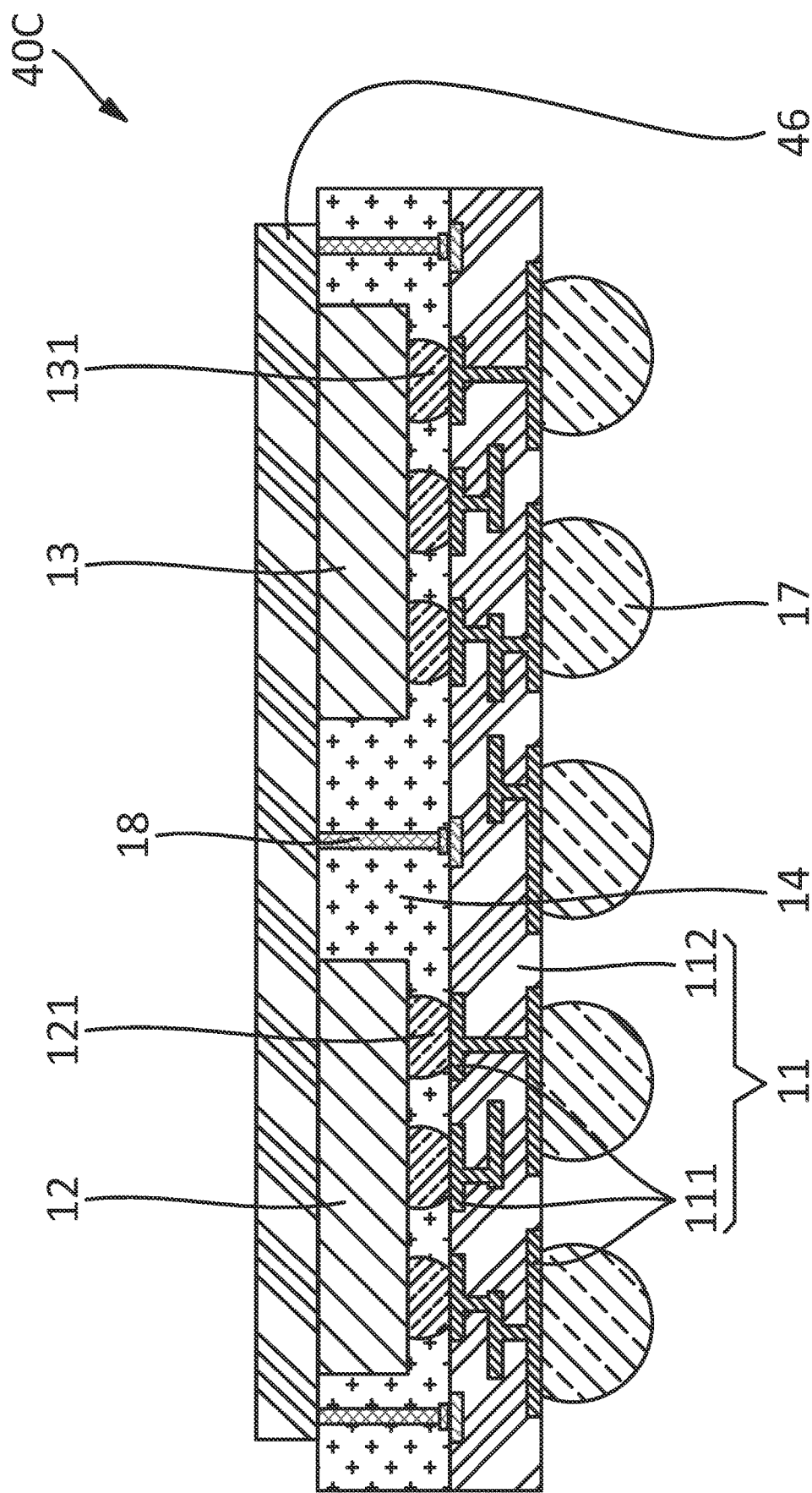

FIG. 9C shows a cross-sectional view of electronic device 40C. In the example shown in FIG. 9C, electronic device 40C can be similar to electronic device 40B of FIG. 9B. Encapsulant 14 exposes top sides of electronic components 12 or 13 and top sides of vertical interconnects 18. Metallic coating 46 can cover portions of the top side of encapsulant 14, optionally leaving some portions exposed. Metallic coating 46 can contact exposed top sides of electronic components 12 or 13 or exposed top sides of vertical interconnects 18.

In some examples, electronic device 40C can be provided by a method of manufacturing similar to that described below with respect to FIG. 10A, with top sides of electronic components 12 or 13 and top sides of vertical interconnects 18 exposed by encapsulant 14. For instance, metallic coating 46 can be provided similar to as described below with respect to FIG. 10A, such as by spraying.

Figure 10A:
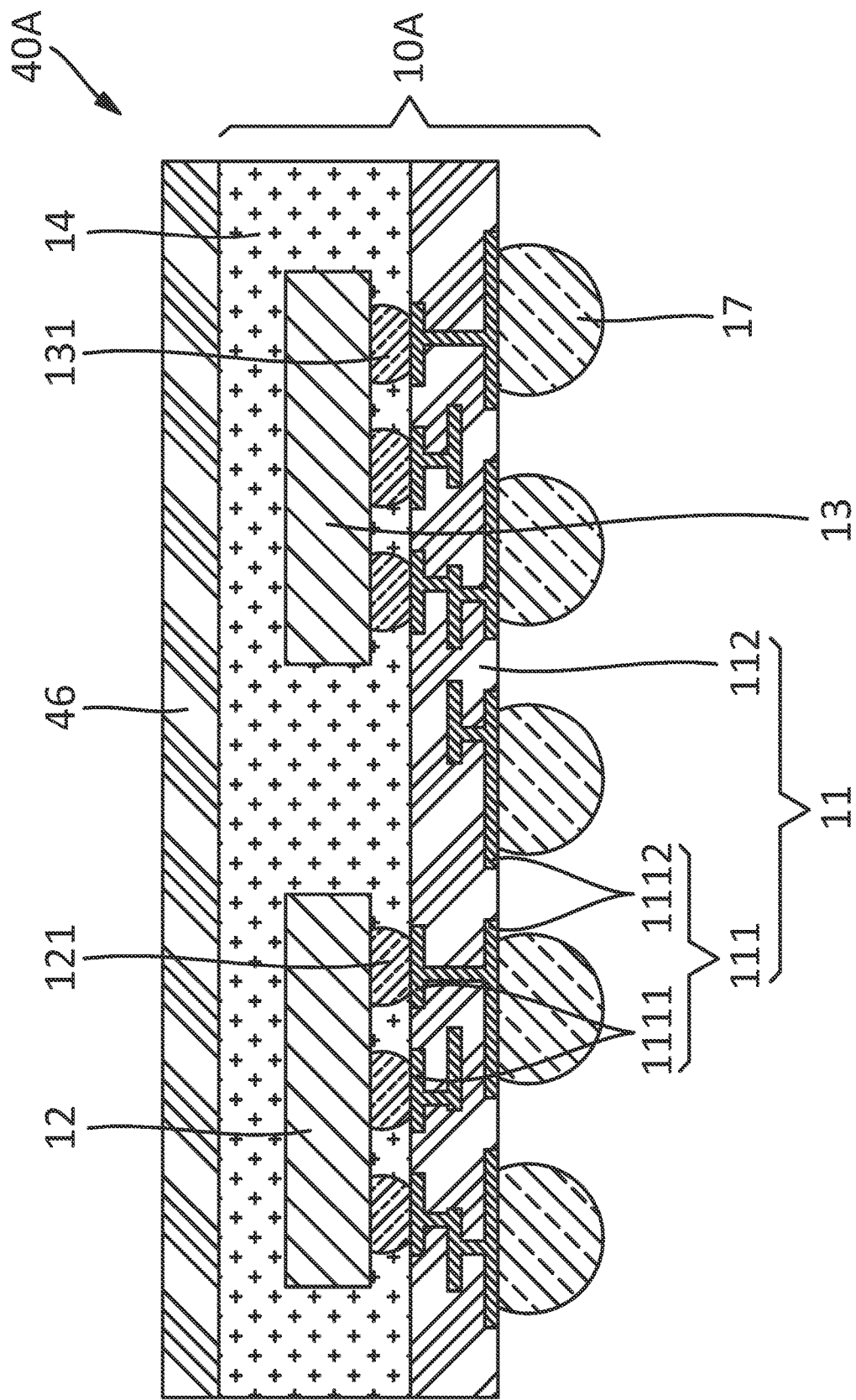
FIGS. 10A and 10B show cross-sectional views of an example method for manufacturing an example electronic device.
Figure 10B:
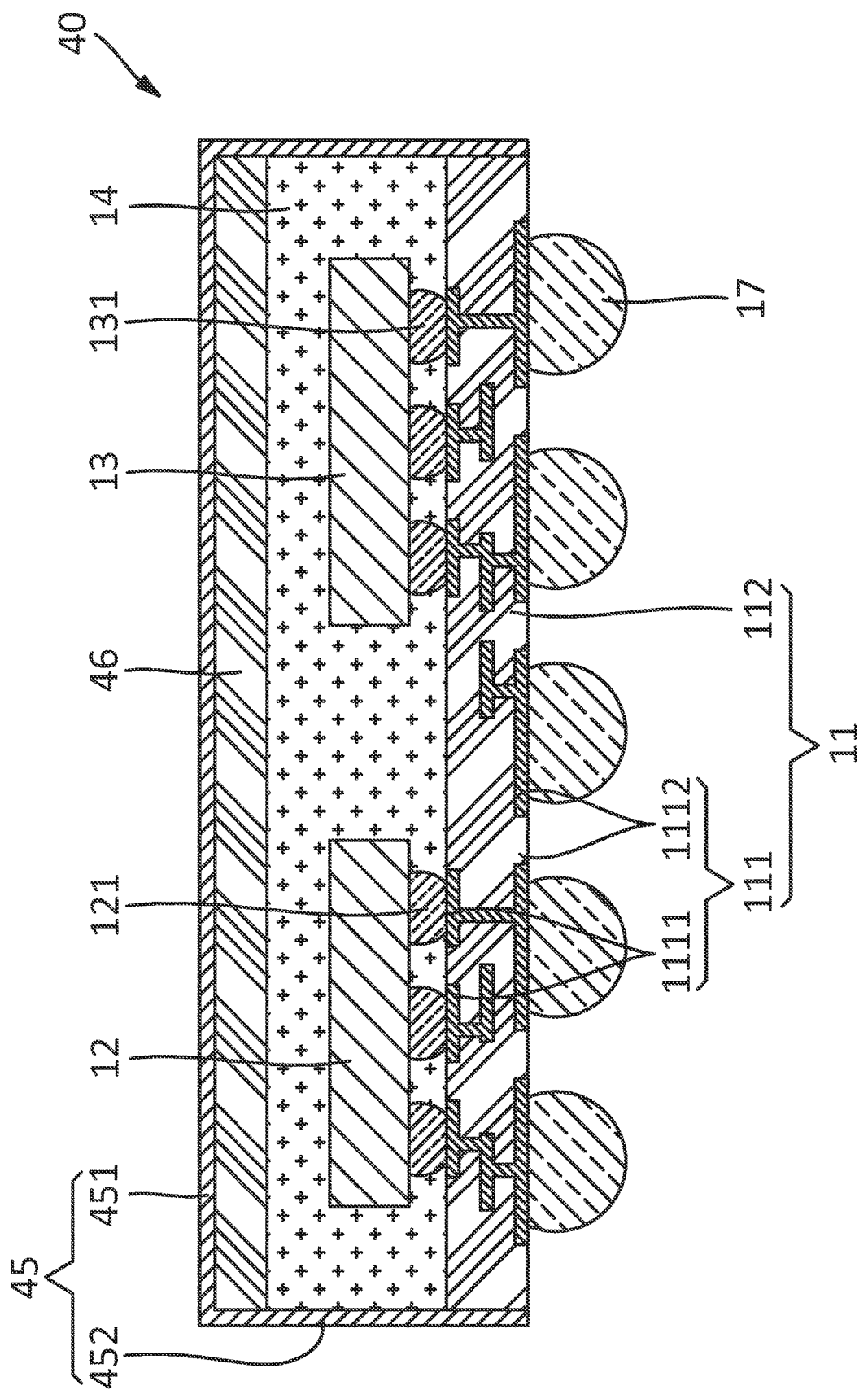

FIGS. 10A to 10B show cross-sectional views of an example method for manufacturing an example electronic device 40 of FIG. 9.

FIG. 10A shows a cross-sectional view of electronic device 40 at an early stage of manufacture. In the example shown in FIG. 10A, metallic coating 46 can be provided on electronic device 10A manufactured by the method shown in FIGS. 2A to 2D. Metallic coating 46 can be provided before electronic device 40 is separated into individual electronic devices 40A through a sawing process. In some examples, metallic coating 46 can be initially provided as a single piece covering an array of electronic devices 10A, before singulating the array into individual electronic devices 40A through a sawing process.

Metallic coating 46 can be provided to cover the upper side of encapsulant 14. In examples where encapsulant 14 exposes the top sides of electronic components 12 or 13, metallic coating 46 can contact such exposed top sides. In some examples, an area of metallic coating 46 can substantially correspond to an area of encapsulant 14. Metallic coating 46 can include corresponding elements, features, materials or manufacturing methods similar to those of thick metallic coating 16.

In some examples, a singulation process of separating substrate 11 into individual electronic devices 40A can be performed by sawing substrate 11, encapsulant 14 and metallic coating 46. Individual electronic device 40A can comprise substrate 11, electronic components 12 or 13, encapsulant 14, metallic coating 46 and external terminal 17.

FIG. 10B shows a cross-sectional view of electronic device 40 at a later stage of manufacture. In the example shown in FIG. 10B, thin metallic coating 45 can be provided to cover metallic coating 46, sidewalls of encapsulant 14, and sidewalls of substrate 11. Thin metallic coating 45 can comprise thin coating topside 451 covering the upper side of metallic coating 46, and thin coating sidewall 452 covering sidewalls of metallic coating 46, sidewalls of encapsulant 14 and sidewalls of substrate 11. Thin metallic coating 45 can include corresponding elements, features, materials or manufacturing methods similar to those of thin metallic coating 15.

Figure 11:
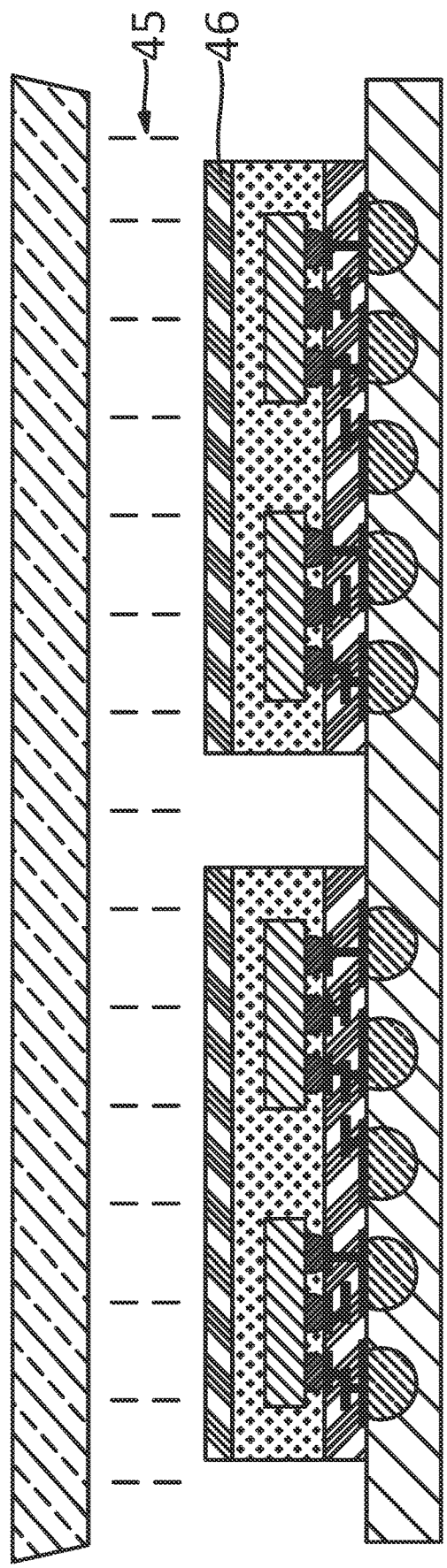
FIG. 11 shows some examples of a method for providing a thin metallic coating shown in FIG. 10B.

In some examples shown in FIG. 11, after fixing electronic device 40 by using a frame with tape, thin metallic coating 45 can be provided to cover metallic coating 46, sidewalls of encapsulant 14, and sidewalls of substrate 11 by sputtering. The frame with the tape can be adhered to the lower side of the electronic device 40 to fix the electronic device 40. Two or more electronic devices 40 can be arranged on a frame with tape so as to be spaced apart from each other in one direction, and thin metallic coating 45 can be provided to cover an upper side and lateral sides of electronic device 40 by a sputtering target.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
a substrate having an upper side, a lower side opposite to the upper side, a lateral side connecting the upper side to the lower side, and a conductive structure;
a first electronic component coupled to the conductive structure at the upper side of the substrate;
an encapsulant covering a lateral side of the first electronic component and the upper side of the substrate and having an encapsulant top side and an encapsulant lateral side;
a first metallic coating having a first metallic coating top side, a first metallic coating sidewall; and a first metallic coating thickness; and
a second metallic coating having a second metallic coating thickness that is greater than the first metallic coating thickness;
wherein:
the first metallic coating top side is over the encapsulant top side;
the first metallic coating sidewall is over the encapsulant lateral side;
the second metallic coating is over the encapsulant top side; and
the first metallic coating top side is interposed between the encapsulant top side and the second metallic coating.

2. The electronic device of claim 1, wherein:
a portion of the first metallic coating is exposed from the second metallic coating.

3. The electronic device of claim 2, wherein:
the portion of the first metallic coating that is exposed from the second metallic coating comprises a center region of the first metallic coating.

4. The electronic device of claim 1, wherein:
the second metallic coating has a second metallic coating sidewall that covers a portion of the first metallic coating sidewall.

5. The electronic device of claim 1, wherein:
the first metallic coating comprises a sputtered layer;
the second metallic coating comprises a sprayed layer; and
the second metallic coating thickness is greater than approximately five (5) times the first metallic coating thickness.

6. The electronic device of claim 1, wherein:
the first metallic coating comprises an electromagnetic interference (EMI) shield; and
the second metallic coating comprises a heat sink.

7. The electronic device of claim 1, wherein:
a top side of the first electronic component is exposed from the encapsulant top side.

8. The electronic device of claim 1, further comprising:
a first vertical interconnect coupled to the upper side of the substrate and contacting the first metallic coating.

9. The electronic device of claim 8, further comprising:
a second vertical interconnect coupled to the upper side of the substrate and contacting the second metallic coating.

10. An electronic device, comprising:
a substrate comprising a dielectric structure, a conductive structure within the dielectric structure, a substrate upper side, a substrate lower side, and a substrate lateral side;
a first electronic component coupled to the conductive structure at the substrate upper side;
an encapsulant covering the first electronic component and the substrate upper side and having an encapsulant top side and an encapsulant lateral side;
a first conformal conductor having a first conformal conductor top side and a first conformal conductor sidewall, where the first conformal conductor top side extends over the encapsulant top side, over the encapsulant lateral side, and over the substrate lateral side; and a second conformal conductor having a second conformal conductor top side over the encapsulant top side;

wherein:
the first conformal conductor has a first thickness;
the second conformal conductor has a second thickness that is greater than the first thickness;
the first conformal conductor is an electronic magnetic interference shield for the electronic device;
the second conformal conductor is a heat sink for the electronic device; and
the first conformal conductor is interposed between the encapsulant top side and the second conformal conductor.

11. The electronic device of claim 10, wherein:
the second conformal conductor has an opening extending through the second conformal conductor to expose a portion of the first conformal conductor from the opening.

12. The electronic device of claim 11, wherein:
the portion of the first conformal conductor that is exposed from the second conformal conductor comprises a center region of the first conformal conductor that is divided into more than one partition.

13. The electronic device of claim 10, wherein:
the first electronic component has a component top side; and
the component top side is exposed from the encapsulant top side.

14. The electronic device of claim 10, further comprising:
a second electronic component coupled to the conductive structure at the substrate upper side and laterally spaced apart from the first electronic component; and
one or more vertical interconnects between the first electronic component and the second electronic component, where the one or more vertical interconnects are coupled to the substrate upper side and to one or more of the first conformal conductor or the second conformal conductor at the encapsulant top side.

15. The electronic device of claim 10, wherein:
the second conformal conductor is interposed between the encapsulant top side and the first conformal conductor top side; and
the second conformal conductor is a metal foil comprising copper.

16. A method of manufacturing an electronic component, comprising:
providing a substrate having an upper side, a lower side opposite to the upper side, a lateral side connecting the upper side to the lower side, and a conductive structure;
coupling a first electronic component to the conductive structure at the upper side of the substrate;
providing an encapsulant covering a lateral side of the first electronic component and the upper side of the substrate and having an encapsulant top side and an encapsulant lateral side;
providing a first metallic coating over the encapsulant top side and the encapsulant lateral side, the first metallic coating having a first metallic coating top side, a first metallic coating sidewall, and a first metallic coating thickness; and
providing a second metallic coating over the first metallic coating, the second metallic coating having a second metallic coating thickness that is greater than the first metallic coating thickness.

17. The method of claim 16, wherein:
providing the second metallic coating comprises providing a portion of the first metallic coating exposed from the second metallic coating.

18. The method of claim 16, wherein:
providing the second metallic coating comprises spraying the second metallic coating.

19. An electronic device, comprising:
a substrate having an upper side, a lower side opposite to the upper side, a lateral side connecting the upper side to the lower side, and a conductive structure;
a first electronic component coupled to the conductive structure at the upper side of the substrate;
an encapsulant covering a lateral side of the first electronic component and the upper side of the substrate and having an encapsulant top side and an encapsulant lateral side;
a first metallic coating having a first metallic coating top side, a first metallic coating sidewall; and a first metallic coating thickness; and
a second metallic coating having a second metallic coating thickness that is greater than the first metallic coating thickness;

wherein:
the first metallic coating top side is over the encapsulant top side;
the first metallic coating sidewall is over the encapsulant lateral side;
the second metallic coating is over the encapsulant top side;
the second metallic coating is interposed between the encapsulant top side and the first metallic coating; and
the first metallic coating sidewall covers lateral sides of the second metallic coating.

20. The electronic device of claim 19, wherein:
the second metallic coating comprises a metal foil.

21. The electronic device of claim 19, wherein:
the first metallic coating comprises a sputtered layer;
the second metallic coating comprises a sprayed layer; and
the second metallic coating thickness is greater than approximately five (5) times the first metallic coating thickness.

22. The electronic device of claim 19, further comprising:
a first vertical interconnect coupled to the upper side of the substrate and contacting the second metallic coating.

23. The electronic device of claim 22, further comprising:
a second vertical interconnect coupled to the upper side of the substrate and contacting the first metallic coating.

* * * * *